United States Patent [19]
Madden et al.

[11] Patent Number: 5,512,895
[45] Date of Patent: Apr. 30, 1996

[54] SAMPLE RATE CONVERTER

[75] Inventors: Timothy J. Madden, Malden, Mass.; Daniel A. Rosenthal, Saratoga, Calif.

[73] Assignee: Teradyne, Inc., Boston, Mass.

[21] Appl. No.: 232,604

[22] Filed: Apr. 25, 1994

[51] Int. Cl.$^6$ .................................................. H03M 7/00
[52] U.S. Cl. ........................................... 341/61; 364/724.1
[58] Field of Search .................. 341/61, 143; 364/724.1

[56] References Cited

U.S. PATENT DOCUMENTS

| | | | |
|---|---|---|---|
| 4,564,918 | 1/1986 | McNally et al. | 364/569 |
| 4,748,578 | 5/1988 | Lagadec et al. | 364/724 |
| 4,780,892 | 10/1988 | Lagadec | 375/118 |
| 4,825,398 | 4/1989 | Koch et al. | 364/724.1 |
| 4,903,019 | 2/1990 | Ito | 341/61 |
| 5,055,843 | 10/1991 | Ferguson, Jr. et al. | 341/143 |
| 5,119,093 | 6/1992 | Vogt et al. | 341/123 |
| 5,272,655 | 12/1993 | Roza | 364/724.1 |
| 5,389,923 | 2/1995 | Iwata et al. | 341/61 |
| 5,398,029 | 3/1995 | Toyama et al. | 341/61 |

OTHER PUBLICATIONS

Adams et al. *VLSI Architectures for Asynchronous Sample–Rate Conversion* Oct. 1992.
Matsuya et al. *A 16–bit Oversampling A–to–D Conversion Technology Using Triple Integration Noise Shaping* Dec. 1987.
Gray *Oversampled Sigma–Delta Modulation* May 1987.
Candy et al. *Double Interpolation for Digital to IEEE Transactions on Communications, Analog Conversions*, Jan. 1986, pp. 77–81.
Miller *Technique Enhances The Performance of PLL Synthesizers* Jan. 1983.
Agrawal et al. *Design Methodology for ΣΔM·Mar. 1983*.

*Primary Examiner*—Marc S. Hoff
*Attorney, Agent, or Firm*—Edmund J. Walsh

[57] ABSTRACT

Method and apparatus for digital sample rate conversion. A mixed signal tester employing digital sample rate conversion is also disclosed. According to the invention, variable phase jitter is introduced into an input digital signal to produce an intermediate signal at a second sampling rate. The intermediate signal is then low pass filtered to produce the output signal. This technique is used in a mixed signal tester where one period of a stimulus signal is stored in a digital memory. The frequency of the analog stimulus signal is dictated by the rate at which the digital signal is retrieved from the memory. Sample rate conversion is used to convert the signal retrieved from memory, regardless of the rate at which it was retrieved, to the sampling rate for which a digital to analog converter has been calibrated.

22 Claims, 5 Drawing Sheets

T₁
SAMPLE RATE = X

FIG. 1A

T₂
SAMPLE RATE = Y

SAMPLE RATE CONVERTER

This invention relates generally to digital signal processing and more particularly to converting a digital signal at a first sampling rate to an identical signal at a second sampling rate.

Digital sample rate conversion is used in many types of digital systems. Audio signals, such as might be generated in making recordings of music, are often processed digitally. The various pieces of equipment used to process and record the signals will not always operate at the same sampling frequency. As a result, it is often necessary that each piece of equipment accept a digital signal sampled at a first rate and then convert it to a digital signal with a second sampling rate before processing it. Of course, the information content of the signal must not be appreciably changed by the sample rate conversion or the sound quality of the signal will be degraded.

A very simple way to accomplish sample rate conversion is to simply drop out samples from the first signal. The output waveform thus has fewer samples per second and therefore has a lower sample rate. Assuming the Nyquist criterion is met in the output signal, it is an accurate representation of the same signal as the input. This process is called "decimation." It is limited, though, to situations in which the sampling rate of the input is an integer multiple of the sampling rate of the output.

A process called interpolation may be used when the sampling rate of the output is intended to be an integer multiple higher than the sampling rate of the input signal. In an interpolation operation, an intermediate signal is first produced by filling the time between samples of the input signal with samples which are arbitrarily assigned the value of zero. The intermediate signal is called a "zero-stuffed" signal. Because samples are added while the time span is kept the same, the zero-stuffed signal has a higher sampling rate than the input signal. The higher frequency zero-stuffed signal is filtered in a digital interpolation filter which smooths out the discontinuities caused by adding the extra samples. The result is a digital signal which has the same shape as the input signal, but contains more samples per second.

The processes of decimation and interpolation may be combined. For example, a circuit could decimate by a factor of M and interpolate by a factor of L. The resulting output would have a sampling rate in a ratio of L/M to the input sampling rate. Such a circuit is, however, limited to scaling the sampling rate by a rational number. More importantly, for a digital system, there are practical limits on the ranges of values for M and L. M can not be so large that the decimated signal no longer satisfies the Nyquist rate. L cannot be made arbitrarily large because the required complexity of the interpolation filter increases as L gets larger.

Filters of various designs could be used for the interpolation filter. However, interpolation filters have been universally implemented as Finite Impulse Response filters (FIR). An FIR has a tapped delay, a coefficient memory, a set of multipliers, an adder and control circuitry. The tapped delay line stores successive values of the input signal. The memory stores a set of filter coefficients, one coefficient for each tap. In operation, the signal value at each tap on the delay line is multiplied by the coefficient value in one coefficient memory and the results are summed to produce an output signal. Unfortunately, multiplier circuits and, to a lesser extent, the control circuitry and the memories are generally expensive or complicated to implement. Work has been done to develop filter architectures which reduce the complexity of the circuit needed to implement an interpolation filter. For example, "polyphase digital filters" have been suggested to reduce the complexity of the interpolation filter. These filters are structured to reduce the number of multiplications that are needed to calculate the output.

Despite these simplifications circuits to process audio quality signals are still very complicated. As used herein, "audio quality" denotes that the processing operation introduces noise at a signal to noise level of less than about 100 dB for signals in the frequency range up to around 60 kHz. For example, a typical interpolation filter for audio quality signals would likely have in excess of 50 taps and would more likely have on the order of 100 taps. In addition, the filter coefficients of an interpolation filter vary depending on the ratio of sampling rates and the bandwidth of the signal being processed, which makes it difficult to use interpolation for sample rate conversion where the ratio of sample rates needs to be programmed. It would be desirable to reduce the use of multipliers in a sample rate converter.

For these reasons, resampling has been widely used as a method of sample rate conversion. With the resampling approach, the input digital signal is converted back to an analog signal. It is filtered to smooth out discontinuities introduced in the digital to analog conversion process and then resampled at the second rate to produce an output digital signal with the desired sampling rate. Resampling still has limitations because analog to digital converters are often expensive and the multiple conversion operations will likely introduce noise into the signal.

As will be hereinafter more fully described, one aspect of the invention is a novel method of digital sample rate conversion. This approach for digital sample rate conversion utilizes a circuit commonly called a "sigma-delta modulator." In its simplest form, a sigma-delta modulator produces a one bit digital output which reflects the magnitude of an input signal. The circuit provides a logic HI, representing a full scale output, whenever the integrated difference between the input and the output is positive and a logic low, representing a zero output, whenever the integrated difference is negative. At any instant in time, it will be extremely unlikely that the output of the sigma-delta modulator equals the value of the input signal. Rather, the output of the sigma-delta modulator will be switching between a value above the input value and a value below the input value. In this way, the average value of the output equals the average value of the input. In more complicated forms, the sigma-delta modulator produces an output signal with a plurality of bits. In each case, though, the output switches between a value above the input value and a value below the input value such that the average value of the output of the sigma-delta modulator equals the average value of the input. Sigma-delta modulators are used in communications systems and are also widely used in analog to digital converters because they efficiently convert an analog signal to digital form.

As will also be hereinafter more fully described, one embodiment of the invention relates to the use of digital sample rate conversion in a mixed signal tester. A mixed signal tester is a system used to test integrated circuits or "chips" which process analog signals, digital signals or both. A mixed signal tester works by applying stimulus signals to the chip or device under test and comparing the response to an output which a properly functioning chip would produce. To produce such signals, testers sometimes store the stimulus signals in digital form in digital memory. During testing, the desired stimulus signal is recalled from memory, converted to an analog signal by a digital to analog converter and applied to the device under test. To produce stimulus signals at different frequencies, the stored signals are retrieved from memories at different rates.

One important function of a mixed signal tester is to determine if the chip being tested produces the appropriate responses at the appropriate times when analog signals are applied to it. To determine if responses are produced at the appropriate time, the analog signals produced by the tester must be "phase locked" to a digital clock inside the tester. Accordingly, all the timing signals used to retrieve analog signals from the memory are derived from one or more digital clocks, which are also phase locked. Generally, lower frequency clocks are derived by dividing down the output of a high frequency master clock. A mixed signal tester will typically include a set of clock dividers that may be programmed to provide a clock signals at whatever frequency is needed to test a chip.

There are several drawbacks to this approach. First, a tester has a limited number of dividers and it is sometimes difficult to determine how they should be programmed to generate clock signals at the required frequencies. Second, if all clock signals must be derived by dividing down a high frequency clock, there are a limited number of frequencies that may be generated. Accordingly, the frequency resolution is limited and the resolution gets worse when higher frequency clocks are used. Third, it is desirable to use "oversampling" digital to analog converters because of their good noise characteristics. However, oversampling converters necessarily must have very high frequency clocks (200 MHz being state of the art). Using an oversampling converter, while providing some advantages, decreases the attainable frequency resolution. Fourth, most digital to analog converters are calibrated for receiving digital signals at a certain sampling rate. While they will operate on signals at different sampling rates, the amount of noise introduced by the digital to analog conversion increases when the sample rate is other than the rate for which the converter is calibrated. Under the current practice, signals applied to the digital analog converter will have different sampling rates, increasing the noise introduced into the system.

Despite this background knowledge being in the public domain, it has not heretofore been realized that it could be used to provide important advantages. In a digital system it would, for example, be very desirable to simply convert a digital signal from a first sample rate to a second sample rate which was not constrained to be a ratio of convenient or small integers. It would be desirable if the circuit to perform this conversion reduced the need for many large or relatively expensive components such as multipliers, large signal RAMs and coefficient ROMs. It would also be advantageous to make a mixed signal tester with a precision analog source that could generate many different phase locked signals at different frequencies without extensive memory or complicated circuitry and with good frequency resolution and precision.

SUMMARY OF THE INVENTION

With the foregoing background in mind, it is an object of this invention to provide a circuit for simply performing digital sample rate conversion.

It is a further object to provide a circuit for sample rate conversion which does not include an interpolation filter.

It is still a further object to provide a simple circuit for producing an analog signal at a programmable frequency.

It is also an object to provide a method of converting the sample rate of a digital signal to a different sample rate.

It is also an object to provide a mixed signal tester which can generate a large number of test signals at a wide range of frequencies which incorporates a small amount of memory for storing those signals.

It is also an object to provide a mixed signal tester using an oversampled digital to analog converter which may generate test signals at frequencies that may be selected with high resolution.

It is also an object to allow a mixed signal tester user to specify signals in terms of arbitrary sample rates, without concern for actual or practical system clock restrictions.

The foregoing and other objects are achieved by a method of digital sample rate conversion comprising interpolating the signal by introducing phase jitter, decimating the jittered signal and then low pass filtering the decimated signal. According to one embodiment of the invention, the circuitry for performing this method utilizes a sigma-delta modulator fed by a ramped signal to control the jitter. According to yet another embodiment of the invention, the circuit is incorporated into a mixed signal tester which includes a memory storing one cycle of numerous test signals. A controller causes a desired one of the test signals to be repeatedly retrieved from the memory at an arbitrary frequency. A digital sample rate conversion circuit converts the sample rate of the retrieved signal to the sample rate for which an analog to digital converter has been calibrated so that the signal, regardless of the frequency at which it is retrieved from the memory, may be accurately converted to analog form for application to a device under test.

BRIEF DESCRIPTION OF THE DRAWINGS

The invention will be better understood by reference to the following detailed description and accompanying drawings in which.

DESCRIPTION OF PREFERRED EMBODIMENT

Figure 1A:
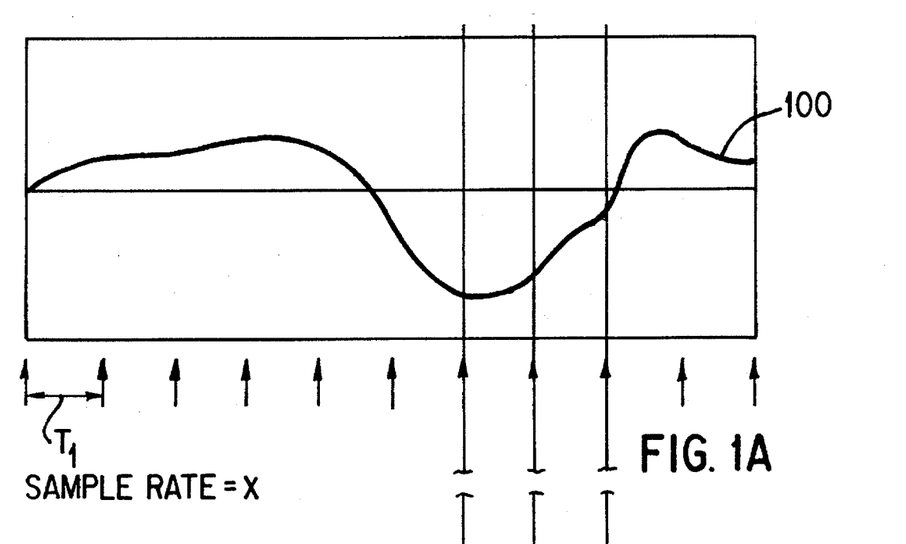
FIG. 1A is a sketch of a waveform sampled at a first sampling rate.
Figure 1B:
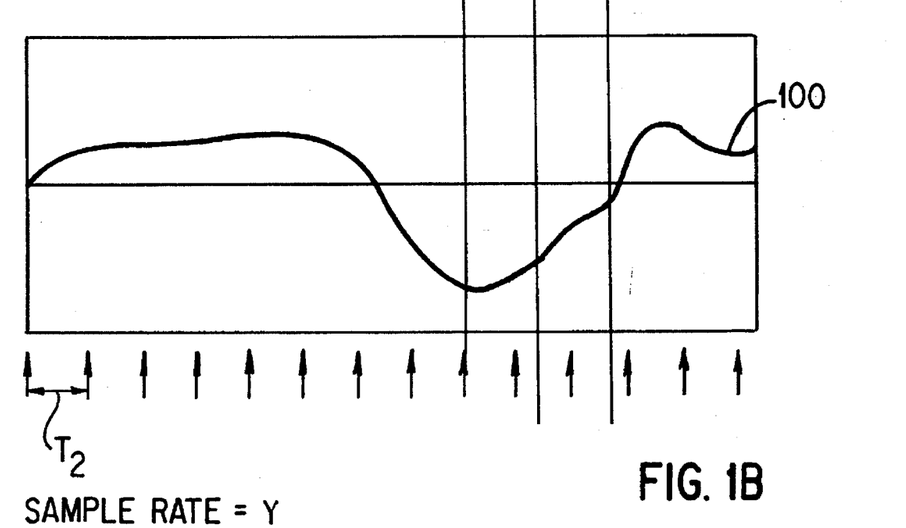
FIG. 1B is a sketch of the waveform of FIG. 1A sampled at a second sample rate.

FIGS. 1A and 1B illustrates a signal 100 which has a value that varies over time. It is well known that such a signal may be represented by a plurality of discrete samples taken at periodic intervals. As shown in FIGS. 1A and 1B, that interval might be $T_1$ or $T_2$. If the sampling period is $T_2$, the values of the samples will be different than if the sampling period is $T_1$. However, in each case (assuming the Nyquist sampling criterion is satisfied) the sampled signal will be a true representation of the original signal 100, i.e. all will have the same information content.

Figure 2:
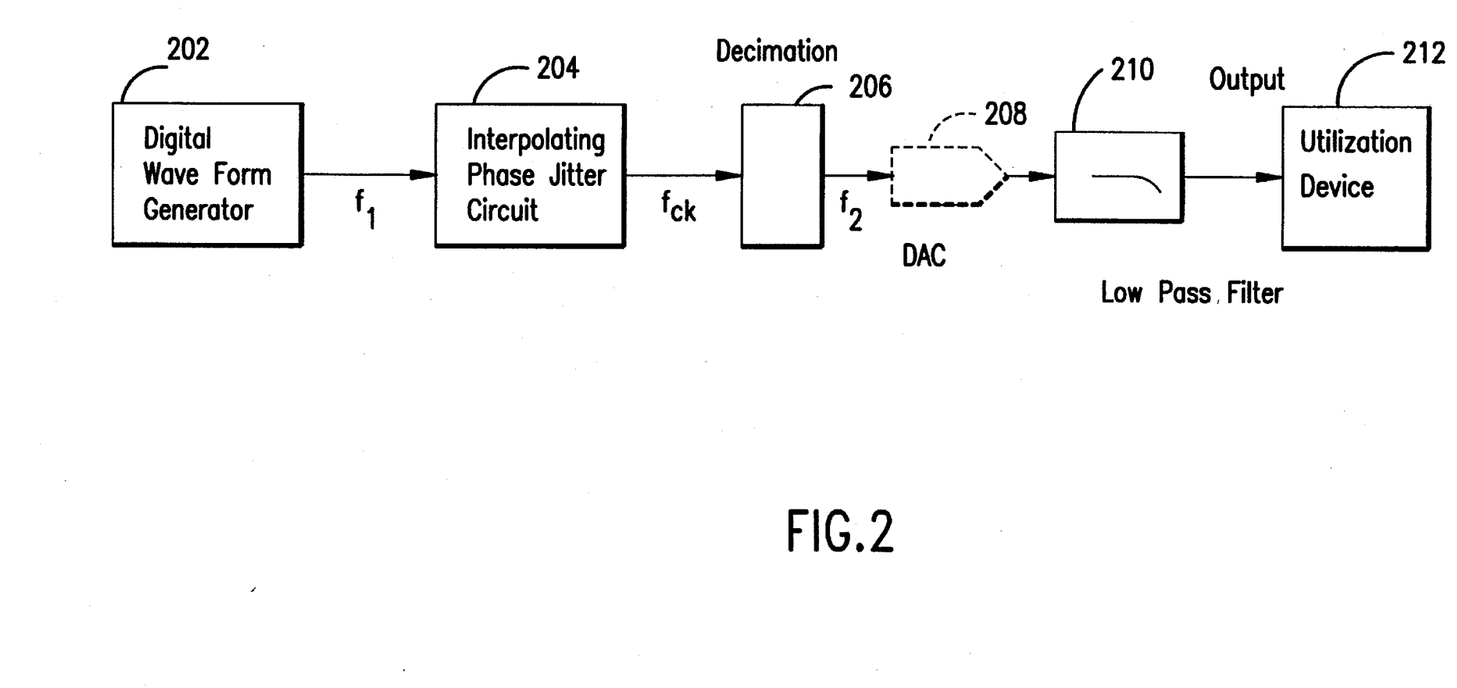
FIG. 2 is a block diagram, greatly simplified, of a circuit according to the invention for performing asynchronous sample rate conversion.

When a discrete signal has samples which are spaced apart by some period T, it may sometimes be necessary to convert it to a discrete signal which has samples spaced apart by some period $T_2$. Turning now to FIG. 2, a circuit which performs this digital sample rate conversion is shown.

Figure 3A:
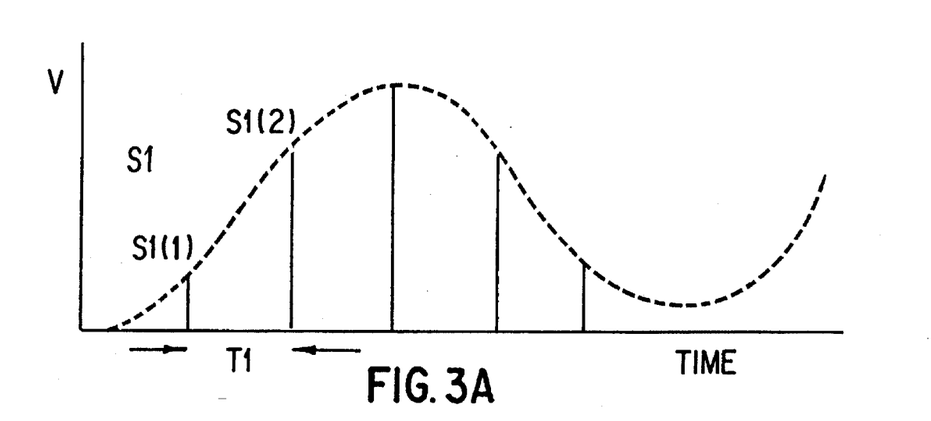
FIG. 3A is a sketch depicting a signal sampled at a first sample rate.

Digital waveform generator 202 provides a digital signal $S_1$ (FIG. 3A) having samples spaced apart by some time $T_1$. Such a signal may also be said to be sampled at a rate of $f_1$ where $f_1$ is the reciprocal of $T_1$. Digital waveform generator 202 may be any known device which generates a digital signal. For example, it might be a digitizing circuit as found in telephone equipment or a digital audio tape. In one important embodiment of the invention, digital waveform generator 202 is a memory storing test signals to be used by a mixed signal tester.

Digital waveform generator 202 provides digital signal $S_1$ to interpolating phase jitter circuit 204. The operation of interpolating phase jitter circuit 204 will be described in greater detail below. Suffice it to say here that interpolating phase jitter circuit produces an output signal $S_{ck}$ (FIG. 3B) with a sampling rate of $f_{ck}$, which is preferably greater than $f_1$. The sampling rate $f_{ck}$ is equal to or greater than the desired sampling rate of the output signal, here denoted $f_2$. Interpolating phase jitter circuit fills in, or interpolates, between two adjacent samples of signal $S_1$ (FIG. 3A) by switching between the adjacent values of signal $S_1$. For example sample $S_1(1)$ (FIG. 3A) has a value of $V_1$ and sample $S_1(2)$ has a value of $V_2$. As can be seen by comparing FIG. 3A to FIG. 3B, the values of signal $S_{ck}$ in the time interval between samples $S_1(1)$ and $S_1(2)$ switch between $V_1$ and $V_2$.

Figure 3B:
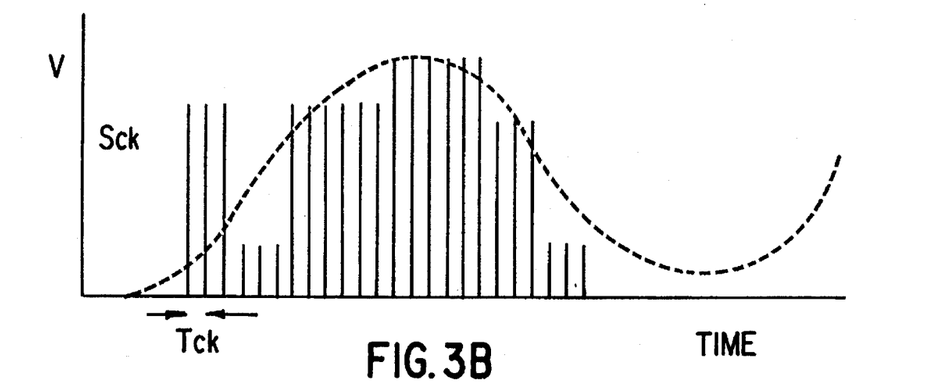
FIG. 3B is a sketch depicting a signal formed from the signal in FIG. 3A by an interpolating process according to the invention.

The switching between $V_1$ and $V_2$ is not, however, periodic. Rather, at the beginning of the interval for times closer to sample $S_1(1)$, the value of signal $S_{ck}$ is more often equal to $V_1$. Conversely, at the end of the interval for times closer to sample $S_1(2)$, the value of signal $S_{ck}$ is more often equal to $V_2$. Over the entire interval, though, the values of signal $S_{ck}$ average to the average of $V_1$ and $V_2$. Thus, interpolating phase jitter circuit 204 operates to produce an output signal $S_{ck}$ by switching at a frequency $f_{ck}$ between adjacent samples (i.e. jittering) of the signal $S_1$.

Figure 3C:
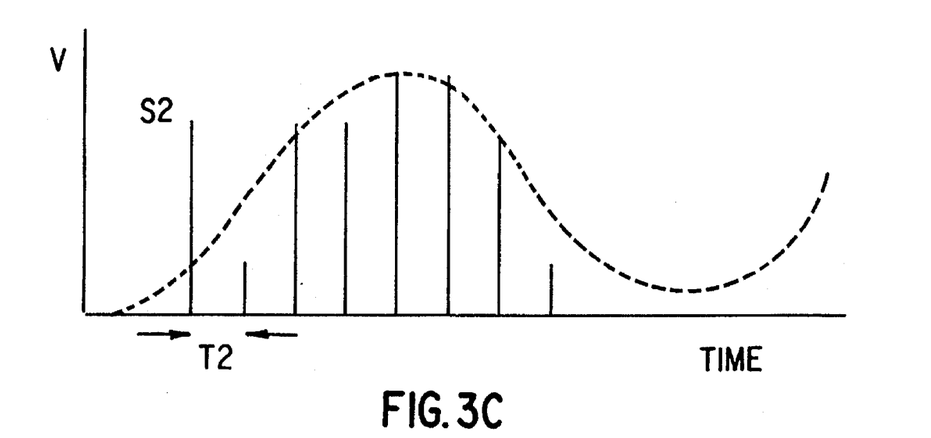
FIG. 3C is a sketch depicting a signal with a second sampling rate formed from the signal in FIG. 3B.

The signal $S_{ck}$ is fed to decimation circuit 206. Decimation 206 is a conventional decimation circuit as known in the art. It produces a signal $S_2$ by selecting samples of signal $S_{ck}$ at periodic intervals $T_2$. Signal $S_2$ therefore has a sampling rate of $f_2$, which is the reciprocal of $T_2$. As may be seen by comparing FIG. 3A and FIG. 3C, there is not necessarily any correlation between the times when samples for signals $S_1$ and $S_2$ occur.

The output of decimation circuit 206 is eventually low pass filtered in filter 210. Low pass filter 210 is of any conventional design and is preferably of very simple design. As shown in FIG. 2 the sample rate converter of the invention may optionally be used in conjunction with a digital to analog converter 208. In that instance, low pass filter 210 would preferably not be a separate filter but would instead be the low pass analog filter which is normally used after a D/A operation. Such filters are generally implemented with an order of 2 or 3. Regardless of whether filter 210 is implemented an analog or digital filter, it preferably has a "complexity measure" below 10 and more preferably below 5 and most preferably below 3. Here a filter with an order of 2 was used. As used herein, the term "complexity measure" means the order of an IIR filter or one half the number of taps in an FIR filter. It will be appreciated that a digital filter with a low complexity will have a small number of multipliers and simple control circuitry such that it avoids the complexity associated with traditional interpolation filters. Here, an IIR filter with less than 20 taps is adequate. More preferably, the filter has less than 10 taps and, if an IIR filter is used, it most preferably has only 6 taps. An alternative way to define a "simple" filter is by how gradually the transfer function of the filter decreases as a function of increasing frequency. As used herein, a "simple" filter should have a transfer function which falls off, above some cutoff frequency, preferably at a maximum rate of 100 dB per decade. More preferably, the fall off should have a maximum of 50 dB per decade and most preferably below 30 dB per decade. Where the output of the sample rate conversion circuit is applied to another circuit element which has a low pass frequency response, it may be possible to entirely omit filter 210. It should also be appreciated that much more complicated filters could be used. They are just not necessary.

Signal $S_2$ may optionally be applied to digital to analog converter (DAC) 208 and converted to an analog signal before filtering. Where DAC 208 is employed, $f_2$ should equal the sampling rate for which DAC 208 has been calibrated. Of course, when DAC 208 is used, filter 210 is an analog filter as is conventionally found used in conjunction with digital to analog converters. Where DAC 208 is omitted, filter 210 is a digital filter.

The output of filter 210 is an output applied to utilization device 211. Where DAC 208 is used, utilization device 211 could be a portion of a mixed signal tester which applies analog signals to devices under test. Where DAC 208 is omitted, the output will be a digital signal with a sampling rate of $f_2$ and utilization device 211 is any known device which operates on a digital signal at a sampling rate of $f_2$.

Figure 4:
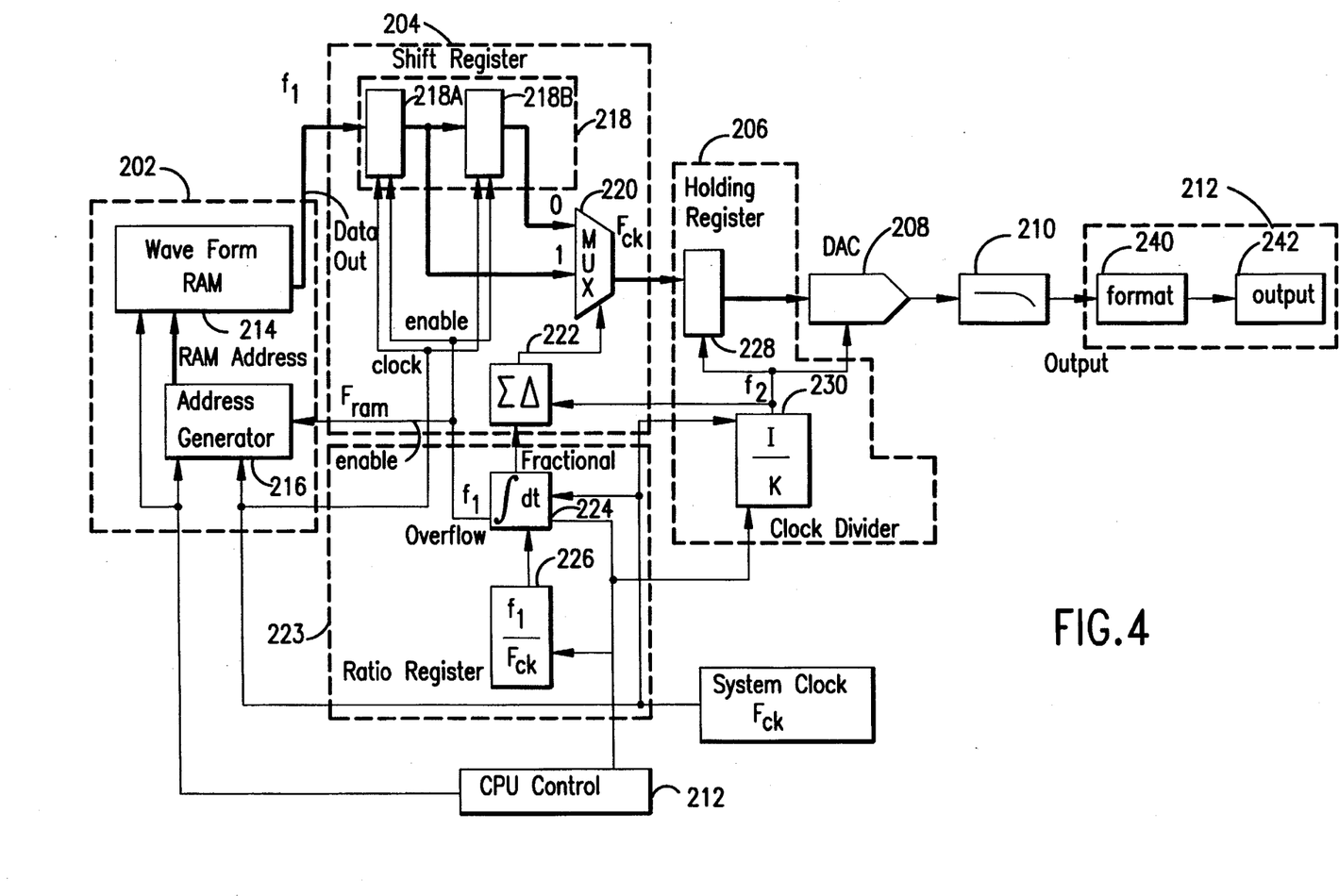
FIG. 4 is a schematic diagram of a circuit according to the invention for performing asynchronous sample rate conversion.

Turning now to FIG. 4, a schematic block diagram of a circuit which implements the functions depicted in FIG. 2 may be seen. A preferred embodiment of the invention is a precision low frequency analog source in a mixed signal tester. In operation, an analog signal is applied to a device under test (DUT) 242 by a format circuit 240. The timing of the application of the analog signal is controlled by a controller 212, which is conventionally a microprocessor running software written by an engineer familiar with the design of DUT 242. Controller 212, format circuit 240 and DUT 242 are as known in the art.

To generate a plurality of analog test signals, the mixed signal tester according to the invention contains a memory 214 which stores a plurality of signals in digital form. Each signal represents one period of a periodic test signal to be applied to DUT 242. The type of memory used for memory 214 is not critical for the invention. For example, RAM or ROM type memory could be used. RAM memory is preferred in a mixed signal tester because it allows controller 212 to load test signals into RAM 214 which are appropriate for testing any given DUT 242.

The total number of samples of each signal stored in memory 214 is also not critical, but will be dictated by the bandwidth of the signals which need to be generated. As a rule of thumb, approximately 1,000 samples are needed per period for both the lowest and highest frequency signals in the memory. Hereafter, the number of samples of each signal stored in memory 214 will be simply designated L. Also, the total number of signals stored in the memory is not critical to the invention, but will be dictated by the number of signals needed to fully test DUT 242. It will, however, be appreciated that the product of the number of signals and the number of samples per signal will dictate the minimum size for memory 214. Also, the width of memory 214 is not critical to the invention. It will be appreciated that the precision of the required output signal will dictate the width of memory 214, with greater precision requiring a wider memory. For purposes of illustration, to implement a precision low frequency analog source in a mixed signal tester sufficiently precise to test a 16 bit analog to digital converter at frequencies up to 1 MHz, memory 214 should be at least 20 bits wide. Also, the amount of noise in the output signal will be inversely proportional to the number of samples of one period of the signal (i.e. the oversampling rate). For audio quality applications, L should be at least 1000. Here, L was chosen to be 1,000 to generate a sine wave. Also, a RAM memory was chosen for memory 214 having a size of 1M by 20 bits with an access time of 30 nsec.

Control circuitry to write the desired signals into memory 214 is not explicitly shown. However, writing to memory is within the skill in the art. The organization of the various signals in memory 214 is also not shown but they are stored in what is known as a "paged" arrangement, with each signal stored on one page. As will be described hereafter, address generator 216 generates addresses to access successive values of one signal stored in memory 214. As will be appreciated, address generator 216 is generating addresses on one page in memory 214. The appropriate page address is generated by controller 212 and selects which of the plurality of signals stored in memory 214 is to be retrieved. Control circuitry to implement a paged memory is not explicitly shown as such a memory structure is well known in the art.

Address generator 216 is a modulo-L counter, where L is the number of samples of one signal stored in memory 214. Modulo-L counters are well known in the art. Briefly, a modulo-L counter has two control inputs, a clock and an enable line. When the enable line is HI and a clock pulse is detected at the clock input, the value stored in the counter increases by one. The counter starts counting at 0 and resets itself to 0 after incrementing L times and then continues counting.

The output of address generator 216 is connected to the address lines of memory 214. As there are L samples representing one period of a signal stored in successive locations of memory 214, address generator causes each sample of the signal to be successively retrieved from memory 214. When all L samples of one period of the signal are retrieved, address generator 216 resets to 0 and the process is repeated, thereby generating a periodic signal.

The period of the signal retrieved from memory 214 is dictated by how long it takes address generator 216 to cycle through L counts. As the frequency of the retrieved signal is the reciprocal of the period, the frequency of the retrieved signal may be controlled by controlling how long it takes for address generator 216 to cycle through L values. It will be appreciated that if a signal stored in memory 214 represents one cycle of a sine wave, a sine wave of any frequency $f_{des}$ may be generated by causing address generator to cycle through L counts in a time equal to the desired period of the sine wave. If each value of the signal is read out of the memory at a frequency $f_1$, $f_{des}$ is determined by selecting $f_1$ from the equation $f_{des}=f_1/L$.

Timing generator 223 generates a clock signal at frequency $f_1$. As with most digital circuits, the circuit of FIG. 4 includes a system clock operating at a frequency $f_{ck}$, which is generally a high frequency such as 20 MHz. However, the exact frequency is not critical to the invention and a preferred embodiment of the invention is in a mixed signal analog tester with a clock frequency of 200 MHz.

To implement a precision low frequency analog source, $f_1$ will be some fraction of $f_{ck}$. The ratio of $f_1$ to $f_{ck}$ is stored in ratio register 226. For long term phase stability, ratio register 226 should preferably be at least twice and more preferably at least three times as long as the words being supplied to DAC 208. In a preferred embodiment, register 226 is 52 bits long. As the ratio of $f_1$ to $f_{ck}$ is less than 1, the value stored in register 226 represents a fraction. As $f_{ck}$ is fixed, the value in ratio register 226 dictates the frequency at which the signal is retrieved from memory 214. Accordingly, the value in ratio register 226 is placed there by controller 212 in order to control the frequency of the signal applied to DUT 242.

The output of ratio register 226 is the input of digital accumulator 224. Digital accumulator 224 is, as known in the art, a digital adder with its output feeding back to its input, and must also be long to provide the desired accuracy. Here digital accumulator is 52 bits long with an additional bit representing overflow. For each pulse of the system clock, digital accumulator 224 increases the value it has stored by the value at its input. As shown in FIG. 4, that value is the value stored in ratio register 226. Accordingly, the value stored in accumulator 224 will add up to 1, and therefore overflow the accumulator, every $1/f_1$ seconds (i.e. at a frequency of $f_1$).

When accumulator 224 overflows, a pulse is produced on its overflow output line. Such pulses occur at the frequency $f_1$. The overflow output of digital integrator 224 is connected to the enable input of address generator 216. The system clock is connected to the count input of address generator 216. Thus, every $1/f_1$ seconds, address generator 216 is enabled and responds to the clock pulse by incrementing its value by one. In this way new values are read from memory 214 at a sampling frequency of $f_1$.

As the sampling frequency $f_1$ is selected by controller 212 to provide a signal with a desired frequency, $f_1$ may be an arbitrary frequency. As DAC 208 is customarily calibrated to operate at a fixed frequency $f_2$, it is desirable to convert the sample rate of the signal retrieved from memory 214 to $f_2$. As shown in FIG. 2, this sample rate conversion is accomplished by first applying the signal to interpolation phase jitter circuit 204.

Interpolation phase jitter circuit 204 comprises a shift register chain made up of a pair of interconnected registers 218A and 218B. Register 218A has its input connected to the output of memory 214. Register 218B has its input connected to the output of register 218A. When registers 218A and 218B are enabled and a clock pulse is received, the value stored in register 218A shifts into register 218B and the output of memory 214 is stored in register 218A. As the enable inputs of registers 218A and 218B are tied to the overflow output of digital accumulator 224, which also enables address generator 216, each time a new value is read out of memory 214, it is stored in register 218A and the preceding sample is stored in register 218B.

To introduce jitter, multiplexer (MUX) 220 selects between the values in registers 218A and 218B to be the output of interpolating phase jitter circuit 204. The output of interpolating phase jitter circuit 204 thus switches between adjacent values of the signal as described above in conjunction with FIGS. 2 and 3. To cause the desired switching, the control input of MUX 220 is fed by sigma-delta modulator 222.

Here, sigma-delta modulator 222 is a one bit modulator. It accepts as its input the value stored in digital accumulator 224. As the input to accumulator 224 is a constant value stored in ratio register 226, the output of digital accumulator will be a ramp increasing at a constant rate proportional to the value in ratio register 226. The ramp starts at 0 and increases by a fractional amount until it reaches 1.

Sigma-delta modulator 222 produces an output which is either 0 or 1. The output will switch between 0 and 1 such that in any given interval the average of the output tends to equal the average of its input. Since the input of the sigma-delta modulator is a ramp which starts at 0, the output of the sigma-delta modulator will initially be zero. As the value of the input ramp increases, the output of sigma-delta modulator will eventually take on a value of 1 for a short period of time so that the average value of its output equals the average value of its input. As the value of the ramp at the input continues to increase, the output of sigma-delta modulator 222 must stay at 1 for longer and longer periods of time. As the ramp at its input nears its maximum value, the output of sigma-delta modulator must stay at 1 almost all of the time to make the average value of its output equal to the average value of its input.

As can be seen in FIG. 4, the output of sigma-delta modulator 222 is connected to the control input of MUX 220. When the output of sigma-delta modulator 222 is 0, MUX 220 passes to the output of interpolating jitter circuit 204 the value in register 218B. When the output of sigma-delta modulator 222 is 1, MUX 220 passes to the output of interpolating jitter circuit 204 the value in register 218A. Since the values in registers 218A and 218B represent two adjacent values of the signal from waveform generator 202, sigma-delta modulator 222 causes MUX 220 to provide as the output of interpolating jitter circuit 204 a signal which is switched between adjacent values of the signal from waveform generator 202. Because sigma-delta modulator 222 is clocked by the output of clock divider 230, this switching occurs at a rate of $f_2$. It will be appreciated, though, that saying the switching occurs at a rate of $f_2$ does not imply that the value at the output actually changes on every cycle—only that it could change that often.

Moreover, because of the operation of sigma-delta modulator 222, MUX 220 switches between the adjacent samples in the pattern described in conjunction with FIG. 3B. Namely, when digital accumulator 224 overflows, a new value of the signal is read out of memory 214. That value is stored in register 218A and the previous value is stored in register 218B. The overflow of accumulator 224 also implies that the value stored in accumulator 224 gets very small. Accordingly, MUX 220 will select the earlier of two adjacent values of the signal from memory 214. As the value stored in accumulator 224 increases again, the output of sigma-delta modulator 222 will eventually become 1 for a short period of time, causing MUX 220 to select the later of the two adjacent values of the signal stored in memory 214. As the value in accumulator 224 increases further, the output of sigma-delta modulator will be 1 more of the time and the later of the two adjacent values will be output more frequently until, at the time when the output of interpolating jitter circuit should equal the later value, the later value is output on almost every cycle.

At that point, though, accumulator 224 overflows again, causing a new value to be read out of memory 214, the value in register 218A to shift into 218B and accumulator 224 and sigma-delta modulator 222 to reset to 0. The process then repeats for every sample coming out of memory 214.

Figure 5:
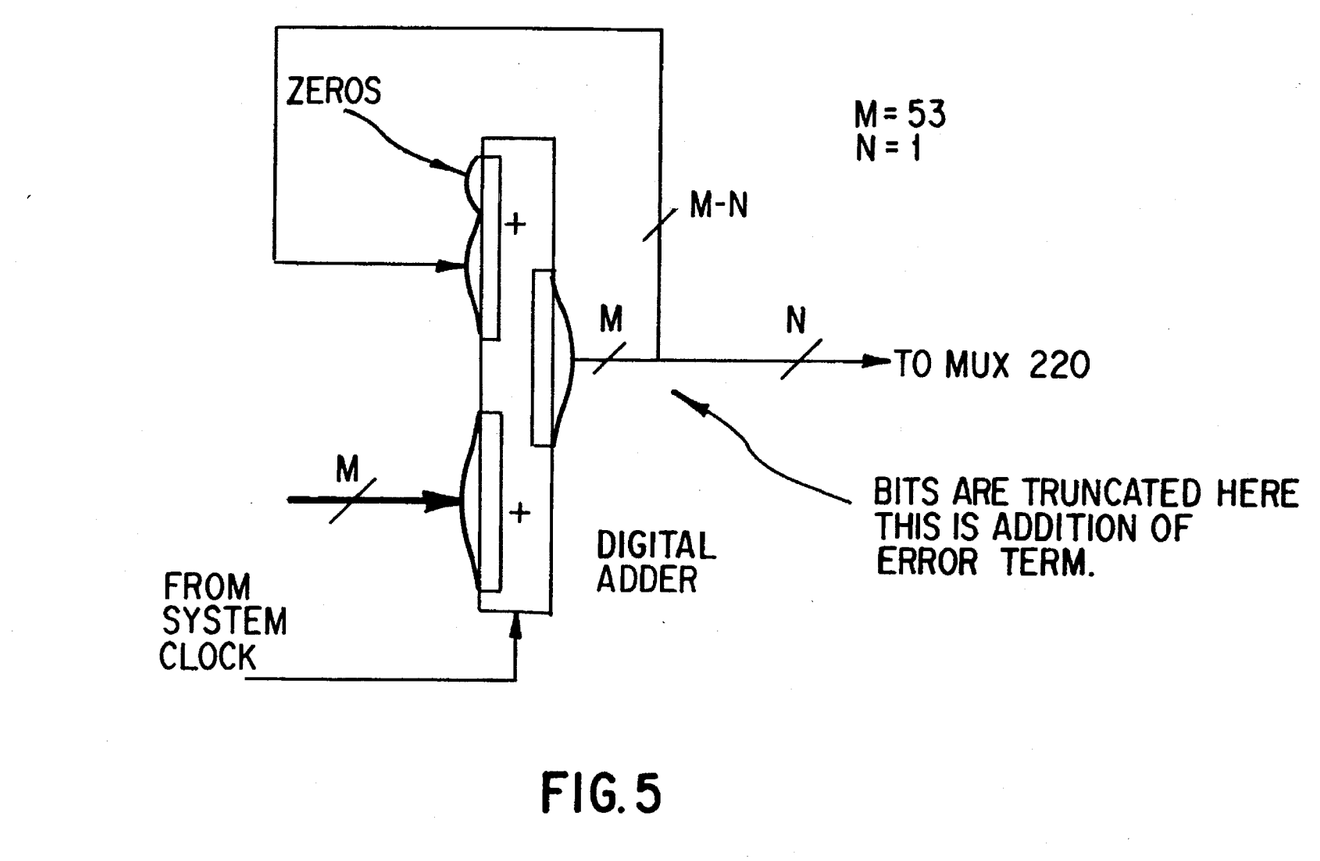
FIG. 5 is a schematic diagram of the sigma-delta modulator circuit of FIG. 4.

FIG. 5 shows a conventional implementation of a first order sigma-delta modulator. It contains a 2's complement digital adder which should be longer than the adder used to implement digital integrator 224. For the examples given here, the adder is 53 bits long. The most significant bit of the output of the adder is the output of the sigma-delta modulator. The remaining bits of the output are fed back to an input to the adder. This feedback represents an accumulated error signal (i.e. the sum of the differences between the output and the input).

Returning to FIG. 4, the output of interpolating jitter circuit 204 is provided to decimation circuit 206. Decimation circuit 206 contains a holding register 228 which is clocked at a frequency $f_2$ which is some frequency less than $f_{ck}$. For the circuit shown in FIG. 4, $f_{ck}$ is an integer multiple, K, of $f_2$ such that holding register 206 may be clocked by the system clock after it has been applied to a divide by K circuit. As is known, a divide by K circuit may be implemented by a modulo-K counter. Such a circuit would be useful for example, to generate a clock signal for a digital to analog converter which requires a 2 MHz clock when the system clock is 20 MHz. In that instance K is 10.

The output of decimation circuit 206 is thus provided at a sampling rate $f_2$. It will be appreciated that $f_2$ is not correlated to $f_1$. However, $f_2$ is phase locked with $f_{ck}$.

In FIG. 4 which shows a precision low frequency analog source portion of a mixed signal tester, the output of decimation circuit 206 is provided to DAC 208. There, the signal is converted to analog form and filtered in a low pass analog filter 210 as is conventionally used with a digital to analog conversion. The analog signal is then provided to format circuit 240 of a type conventionally used in a mixed signal tester. Thereafter, it is applied to DUT 242.

The operation of the circuit of FIG. 4 might be better understood by considering the signal theory behind its operation. The signal in memory 214 could be considered to be a sine wave or the summation of numerous sine wave, all of which could be considered independently. Accordingly, if the signal may be denoted X(t) and expressed in the general form $X(t)=\sin(\omega t)$ where $\omega=2\pi(f_{des}/f_1)$. The output Y(t) of interpolating phase jitter circuit 204 is the same as the input, just with phase error introduced such that $Y(t)=\sin(\omega t+e(t))$. The term e(t) reflects the phase error that is introuduced by selecting a value for the output signal for some time from values of the input signal at similar, but not identical, times. If the samples of the input signal are sufficiently close together, e(t) is relatively small so that sin (e(t)) may be approximated as e(t) and cos(e(t)) may be approxiamated as 1. Y(t) can be rewritten using trigonometric indentities to be $Y(t)=\sin(\omega t)+e(t)\cos(\omega t)$. If X(t) has been sufficiently oversampled, $\omega$ will also be small. The error e(t) represents that a signal $\omega t$ which should be a continuous signals is actually taking on one of a discrete number of values. The error e(t) is thus quantization noise introduced by the sigma-dalta modulator.

It is well known that the error introduced by sigma-delta quantization has an auto spectral power density E(w) which increases with frequency. The product $e(t)\cos(\omega t)$ will have an auto spectral power density of $\frac{1}{2}E(w+\omega)+\frac{1}{2}E(w-\omega)$. For small $\omega$, this value will resemble E(w), which increases with frequency. The error may therefore be minimized by low pass filtering the output, such as in filter 210.

While the oversampling rate needed to make the above assumptions sufficiently accurate for any given application could be calculated, it is preferably determined by computer simulation.

Having described an embodiment of the invention, it will be apparent that numberous alternative embodiments could be made without departing from the inventive concept. The circuit of FIG. 4 was described as if it were made of discrete circuit elements connected together. Such a circuit could be made by physically wiring together separate integrated circuit chips. The same circuit could be made by implementing more than one of the elements shown in FIG. 4 on one integrated circuit chip. For example, address generator 216, registers 218A and 218B, MUX 220, sigma-delta modulator 222, accumulator 224, ratio register 226, holding register 206 and clock divider 230 could all be implemented on an ASIC chip. It will be appreciated that circuits needed to implement these elements are normally included in standard cell libraries sold by manufacturers of ASICs.

Variations might also be made to the specific implementation in FIG. 4. For example, L, the number of samples in one period of the signal stored in memory 214, was described above to be a constant. The value of L could be different for each signal stored in memory 214. Also, frequency $f_2$ was described as being derived from the system clock. No such limitation need be imposed. Additionally, the sigma-delta modulator in FIG. 4 quantized its input signal into one of two states to control the selection of one of two adjacent samples. Greater accuracy could be obtained, though with slight added circuit complexity, if a sigma-delta modulator which quantized to more than two states were used. Such a quantizer would control the selection between more than two adjacent samples and a corresponding number of shift registers would be needed in shift register chain 218. Also, it was described in FIG. 2 that a signal $S_{ck}$ was produced by interpolating phase jitter circuit 204 at a sample rate of $f_{ck}$ and then decimated to a sample rate of $f_2$ by decimation circuit 206. The invention was more simply implemented in FIG. 4 because interpolation phase jitter circuit 204 produced samples at a sample rate of $f_2$.

Further, FIG. 5 showed what is termed a "first order" sigma-delta modulator because it contains only one accumulator. Higher order sigma-delta modulators are known which contain more than one accumulator. Such higher order sigma-delta modulators would provide greater accuracy, again at the cost of greater circuit complexity.

Also, FIG. 4 shows that values of a signal are read out of memory 214 under control of an address generator. The values from the memory are then stored in shift register chain 218. Output values are selected from this shift register chain according to an address generated by sigma-delta modulator 222. It would be possible to reduce the number of circuit elements required if the sigma-delta modulator quantized its input to as many levels as there were samples of the signal stored in memory 214. In this way, the sigma-delta modulator could act as the address generator for memory 214 while at the same time providing the desired jitter in the signal. If this change were made, digital accumulator would also need to be adjusted to overflow at a rate of $f_{des}$ rather than at the rate of $f_1$. Such a modification would be most useful if L is a power of 2.

Accordingly, the invention should be limited only by the spirit and scope of the appended claims.

We claim:

1. A method of converting the sampling rate of an input digital signal from a first rate $f_1$ to a second rate $f_2$ comprising the steps of:
   a) forming a signal having a sampling rate of $f_2$ by:
      i) identifying at least two adjacent values of the input digital signal, said values being ordered from earlier to later;
      ii) during a predetermined interval of time equal to the time between samples of the input digital signal, selecting one of the identified values every $1/f_2$ seconds, wherein the rate at which any one of the identified adjacent values is selected varies over the predetermined interval of time, with the rate at which the earlier values are selected is greater earlier in the interval and the rate at which the later values are selected is greater later in the interval;
      iii) identifying a new group of adjacent values of the input digital signal and repeating step ii);
   b) low pass filtering the signal having a sampling rate of $f_2$.

2. The method of claim 1 wherein the step of identifying at least two adjacent values consists of identifying two adjacent values.

3. The method of claim 1 wherein the input digital signal has a highest frequency component and the sampling rate $f_1$ exceeds 100 times said highest frequency.

4. The method of claim 3 wherein the sampling rate $f_1$ exceeds 1000 times said highest frequency.

5. The method of claim 1 wherein the step of selecting one of the identified values during a predetermined interval of time comprises:
   a) a generating a control signal having a value which increases over the predetermined interval of time;
   b) quantizing the control signal into as many levels as there are identified adjacent values of the input digital signal such that each identified adjacent value corresponds to one quantization level; and
   c) selecting the identified adjacent value corresponding to the quantized value of the control signal.

6. The method of claim 5 wherein the step of quantizing comprises quantizing with a sigma-delta modulator.

7. The method of claim 5 wherein the step of generating a control signal comprises generating a control signal which increases at a rate proportional to $f_1$.

8. A method of converting the sampling rate of an input digital signal from $f_1$ to $f_2$ comprising the steps of:
   a) forming an intermediate digital signal from the input digital signal by introducing a variable amount of phase jitter into the input digital signal;
   b) selecting samples of the intermediate digital signal to produce a signal with a sampling rate of $f_2$;
   c) applying the signal with a sampling rate of $f_2$ to a circuit element having a low pass frequency response.

9. The method of claim 8 wherein the sampling rate of the input digital signal is oversampled at an oversampling rate of at least 500.

10. The method of claim 9 wherein the phase jitter is varied such that the instantaneous average phase difference between the input signal and the intermediate signal increases between samples of the input signal.

11. Apparatus for converting the sampling rate of a digital signal from $f_1$ to $f_2$ comprising:
   a) memory means for storing a plurality of adjacent samples of the digital signal;
   b) means for forming a second signal at a sampling frequency of $f_2$, said means comprising:
      i) means for generating a ramp signal;
      ii) means for quantizing the ramp signal into one of a plurality of quantization levels, with each of the plurality of quantization levels corresponding to one of the plurality of adjacent samples stored in the memory means; and
      iii) means for selecting at a frequency of $f_2$ the samples stored in the memory means corresponding to the quantized value of the ramp signal; and d) a low pass filter coupled to the means for forming a second signal.

12. The apparatus of claim 11 wherein the means for quantizing comprises a sigma-delta modulator.

13. The apparatus of claim 11 additionally comprising:
   a) means, operating at the rate of $f_1$, for reloading the memory means with adjacent samples of the input signal; and
   b) means for resetting the value of the ramp signal when the memory means is reloaded.

14. Apparatus for converting the sampling rate of a digital signal from $f_1$ to $f_2$ comprising:
   a) at least two registers, each having an input, an output and clock input, interconnected to form a shift register chain, with the input of the first register in the shift register chain adapted to receive the digital signal;
   b) a multiplexer having a plurality of inputs, a control input and one output, each of the plurality of inputs coupled to one of the at least two registers and said output forming the output of the apparatus;
   c) a sigma-delta modulator having an input, an output coupled to the control input of the multiplexer and a clock input;
   d) a means for generating a clock signal at a frequency $f_2$, said means coupled to the clock input of the sigma-delta modulator;
   e) a means for generating a clock signal at the frequency $f_1$, said means connected to the clock input of each of the at least two registers; and
   f) means for generating a ramp signal increasing a rate proportional to $f_1$, said means coupled to the input of the sigma delta modulator.

15. A mixed signal tester having circuitry to apply an analog signal to a device under test, said circuitry comprising:
   a) a memory storing samples of at least one period of at least one stimulus signal;
   b) control means, coupled to the memory, for retrieving samples from the memory at a selectable rate $f_1$;
   c) means for converting the sampling rate of the signal retrieved from memory from $f_1$ to $f_2$;
   d) a digital to analog converter operating at a frequency $f_2$ having a digital input and an analog output, said digital input coupled to the means for converting;
   e) format circuit means, coupled to the analog output of the digital to analog converter, for applying the signal at the analog output to a device under test.

16. The mixed signal tester of claim 15 wherein the memory stores at least one period of a plurality of stimulus signals.

17. The mixed signal tester of claim 16 wherein the memory comprises a RAM and additionally comprising means for loading the plurality of stimulus signals into the RAM.

18. The mixed signal tester of claim 15 wherein the means for converting the sampling rate generates an intermediate signal with a sampling rate of $f_{ck}$ which is an integer multiple of $f_2$.

19. The mixed signal tester of claim 15 wherein the means for converting the sampling rate comprises:
   a) memory means for storing a plurality of adjacent samples of the signal retrieved from memory;
   b) means for forming a second signal at a sampling frequency of $f_2$, said means comprising:
      i) means for generating a ramp signal;
      ii) means for quantizing the ramp signal into one of a plurality of quantization levels, with each of the plurality of quantization levels corresponding to one of the plurality of adjacent samples stored in the memory means; and
      iii) means for selecting at a frequency of $f_2$ the samples stored in the memory means corresponding to the quantized value of the ramp signal.

20. The mixed signal tester of claim 19 wherein the means for quantizing comprises a sigma-delta modulator.

21. The mixed signal tester of claim 15 wherein the digital to analog converter comprises an oversampled digital to analog converter.

22. The mixed signal tester of claim 21 wherein the memory stores at least 1000 samples of one period.

* * * * *